(12) United States Patent
Adams et al.

(10) Patent No.: US 7,032,144 B2
(45) Date of Patent: Apr. 18, 2006

(54) METHOD AND APPARATUS FOR TESTING MULTI-PORT MEMORIES

(75) Inventors: R. Dean Adams, St. George, VT (US); Thomas J. Eckenrode, Endicott, NY (US); Steven L. Gregor, Endicott, NY (US); Kamran Zarrineh, Vescal, NY (US)

(73) Assignee: Cadence Design Systems Inc., San Jose, CA (US)

( * ) Notice: Subject to any disclaimer, the term of this patent is extended or adjusted under 35 U.S.C. 154(b) by 69 days.

(21) Appl. No.: 10/425,003

(22) Filed: Apr. 28, 2003

(65) Prior Publication Data

US 2004/0006727 A1 Jan. 8, 2004

Related U.S. Application Data

(63) Continuation of application No. 09/514,870, filed on Feb. 28, 2000, now Pat. No. 6,557,127.

(51) Int. Cl.
*G11C 29/00* (2006.01)

(52) U.S. Cl. ........................ 714/719; 365/201; 714/42

(58) Field of Classification Search ................ 365/201; 714/42, 718–719
See application file for complete search history.

(56) References Cited

U.S. PATENT DOCUMENTS

| | | | |
|---|---|---|---|
| 5,040,150 A | 8/1991 | Naitoh et al. ................ 365/201 |
| 5,778,425 A | 7/1998 | Shigeeda .................... 709/316 |
| 5,802,070 A | 9/1998 | Adams et al. ............. 371/21.1 |
| 5,818,772 A | 10/1998 | Kuge .......................... 365/201 |
| 5,831,988 A | 11/1998 | Fagerness ................... 371/21.2 |
| 5,896,331 A | 4/1999 | Crafts ........................ 365/201 |
| 5,903,575 A | 5/1999 | Kikuda ...................... 371/21.2 |
| 5,917,832 A | 6/1999 | Baeg et al. ................ 371/21.2 |
| 5,918,003 A | 6/1999 | Koch et al. ............ 395/183.06 |
| 5,925,142 A | 7/1999 | Raad et al. ................. 714/719 |
| 6,046,946 A | 4/2000 | Nadeau-Dostie et al. ... 365/201 |
| 6,070,256 A | 5/2000 | Wu et al. .................... 714/718 |
| 6,173,425 B1 | 1/2001 | Knaack et al. ............. 714/718 |
| 6,216,241 B1 | 4/2001 | Fenstermaker et al. ..... 714/718 |
| 6,360,344 B1 | 3/2002 | Khoche et al. ............. 714/733 |
| 6,557,127 B1 * | 4/2003 | Adams et al. .............. 714/718 |

FOREIGN PATENT DOCUMENTS

| | | |
|---|---|---|
| EP | 0439189 A1 | 1/1991 |
| EP | 536026 A1 | 4/1993 |
| JP | 363103984 A | 5/1998 |

OTHER PUBLICATIONS

V. Castro Alves, et al.; Testing Embedded Single and Multiport Rams Using BIST and Boundary Scan; 1992 IEEE; Mar. 1992 pp. 159-163.*

Yuejian Wu; Gupta, S.; Built-in self-test for multi-port RAMs; Test Symposium, 1997. (ATS '97) Proceedings., Sixth Asian Nov. 17-19 1997; Page(s): 398-403.*

(Continued)

*Primary Examiner*—R. Stephen Dildine
(74) *Attorney, Agent, or Firm*—Orrick, Herrington & Sutcliffe LLP

(57) ABSTRACT

A method and system for testing multiported memories, especially when one or more of the ports are not directly accessible without intervening logic. The method and system segregates the multiported memory into at least two portions which are then used for testing the one or more ports which are not directly accessible.

12 Claims, 3 Drawing Sheets

OTHER PUBLICATIONS

Hamdioui, S.; van de Goor, A.J.; March tests for word-oriented two-port memories; Test Symposium, 1999. (ATS '99) Proceedings. Eighth Asian 1999 Page(s): 53-60.*

Narayanan, V. et al.; A built-in self-testing method for embedded multiport memory arrays; Instrumentation and Measurement Technology Conference, 2004. IMTC 04. Proceedings of the 21st IEEE; vol.: 3 May 18-20, 2004; pp. 2027-2032.*

1992 IEEE, "Testing Embedded Single and Multi-Port Rams Using BIST and Boundary Scan," Mar. 1992, V. Castro Alves, et al. p. 159.

* cited by examiner

METHOD AND APPARATUS FOR TESTING MULTI-PORT MEMORIES

This is a continuation of application Ser. No. 09/514,870, filed Feb. 28, 2000, which will issue as U.S. Pat. No. 6,557,127 on Apr. 29, 2003.

BACKGROUND

1. Technical Field of the Present Invention

The present invention generally relates to methods and apparatuses that test memories for errors, and more specifically, to such methods and apparatuses that test embedded memories for errors.

2. Background of the Present Invention

The electronic industry is in a state of evolution spurred by the recent changes in technology which have allowed greater functionality in smaller devices. This has resulted in the explosion of new found uses for such small devices (e.g. medical, monitoring etc.), as well as greater functionality in increasingly smaller electronic devices.

The evolution has caused electronic devices to become an inseparable part of our society. Consumers are now buying and demanding electronic devices which are smaller, more powerful, and faster at unprecedented rates. These demands are constantly driving the electronic industry to exceed limitations which were previously considered unsurpassable.

One area ripe for improvement is the testing of embedded memory within Integrated Circuits (ICs). This is particularly true for Multi-port memories which are now being used in numerous applications such as microprocessors and communications devices. Previous methods used for testing embedded multi-port memories are often inapplicable as a result of the surrounding high gate count and the sheer number of ports. Specifically, the high gate count often makes complete tests of the multi-port memories impossible or extremely difficult because of the problems associated with reaching the data, address, and control signals from external pins. In addition, the sheer number of ports in a memory makes testing extremely difficult due to the number of possible simultaneous operations and paths in and out of the memory.

It would, therefore, be a distinct advantage to have a method and apparatus that would use portions of the embedded memories themselves to perform tests on their integrity. The present invention provides such a method and apparatus.

SUMMARY OF THE PRESENT INVENTION

The present invention is a method and system for testing multiported memories, especially when one or more of the ports are not directly accessible without intervening logic. The method and system segregates the multiported memory into at least two portions for testing the one or more ports which are not directly accessible.

BRIEF DESCRIPTION OF THE DRAWINGS

The present invention will be better understood and its numerous objects and advantages will become more apparent to those skilled in the art by reference to the following drawings, in conjunction with the accompanying specification, in which.

DETAILED DESCRIPTION OF THE PREFERRED EMBODIMENT OF THE PRESENT INVENTION

In the following description, numerous specific details are set forth in order to provide a thorough understanding of the present invention. However, it will be obvious to those of ordinary skill in the art that the present invention can be practiced with different details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention, and are within the skills of persons of ordinary skill in the relevant art.

Memories are tested to ensure that they operate as designed. Typically, test patterns or models are used to verify these operations. Such patterns or models are designed to test certain known ways in which memories usually fail (e.g. stuck-at, transition, coupling, and neighborhood patterns sensitive faults). An example of a March C-pattern for testing memories is illustrated in Table I below.

TABLE I

1. Write 0s at each address throughout memory.
2. Read 0 then write 1 incrementing through each address in memory.
3. Read 1 then write 0 incrementing thorough each address in memory.
4. Read 0 then write 1 decrementing through each address in memory.
5. Read 1 then write 0 decrementing through each address in memory.
6. Read 0s at each address through memory.

These patterns are most effective when you have direct access to the inputs and outputs of the memory. Occasionally, designs are created where the inputs and outputs of the memory are not directly accessible and some logic or another memory must be used to access the memory under test as illustrated in FIG. 1.

Figure 1:
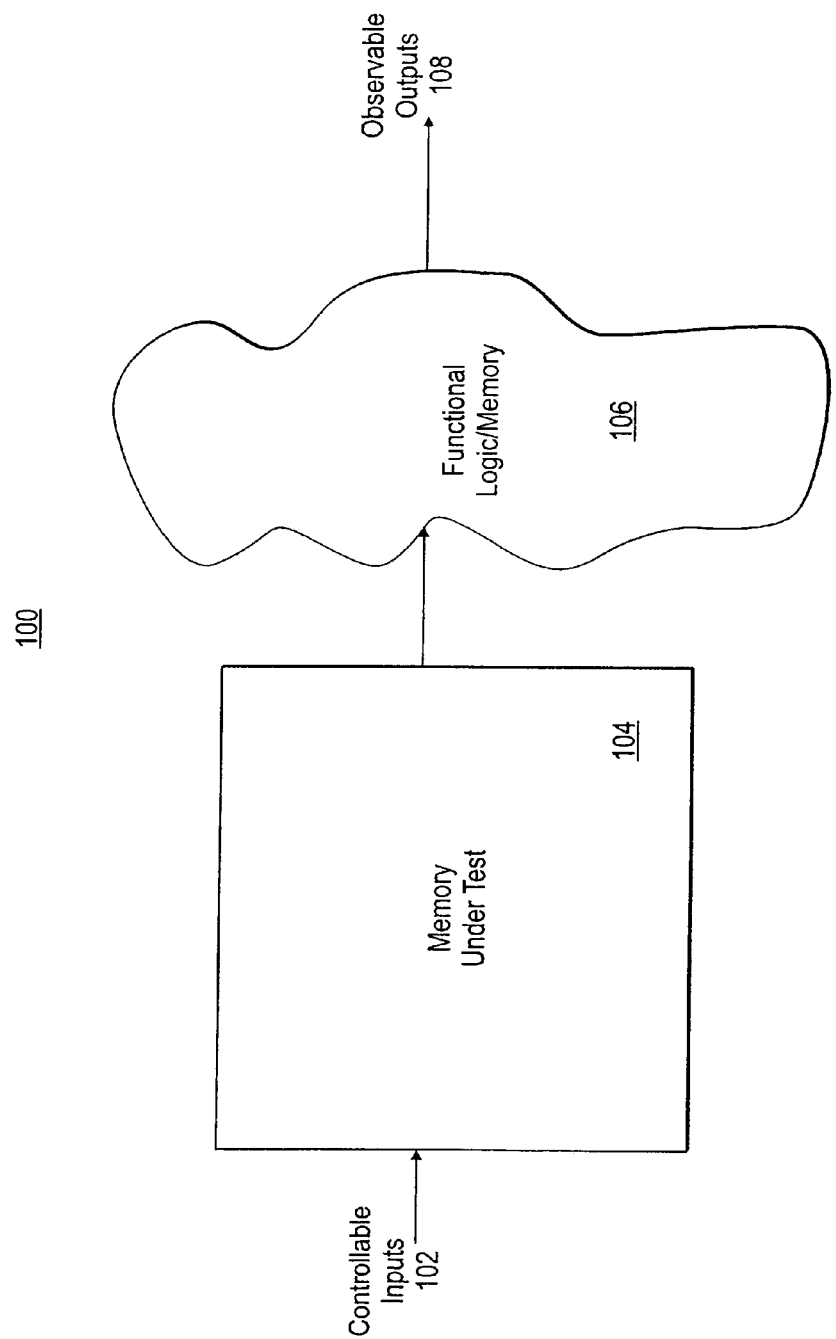
FIG. 1 is a block diagram illustrating a memory system having a memory with outputs that are not directly accessible.

FIG. 1 is a block diagram illustrating a memory system 100 having a memory 104 with outputs that are not directly accessible. Specifically, memory system 100 includes the memory under test 104 having directly accessible controllable inputs 102 and observable outputs 108 via functional logic/memory 106.

Figure 2:
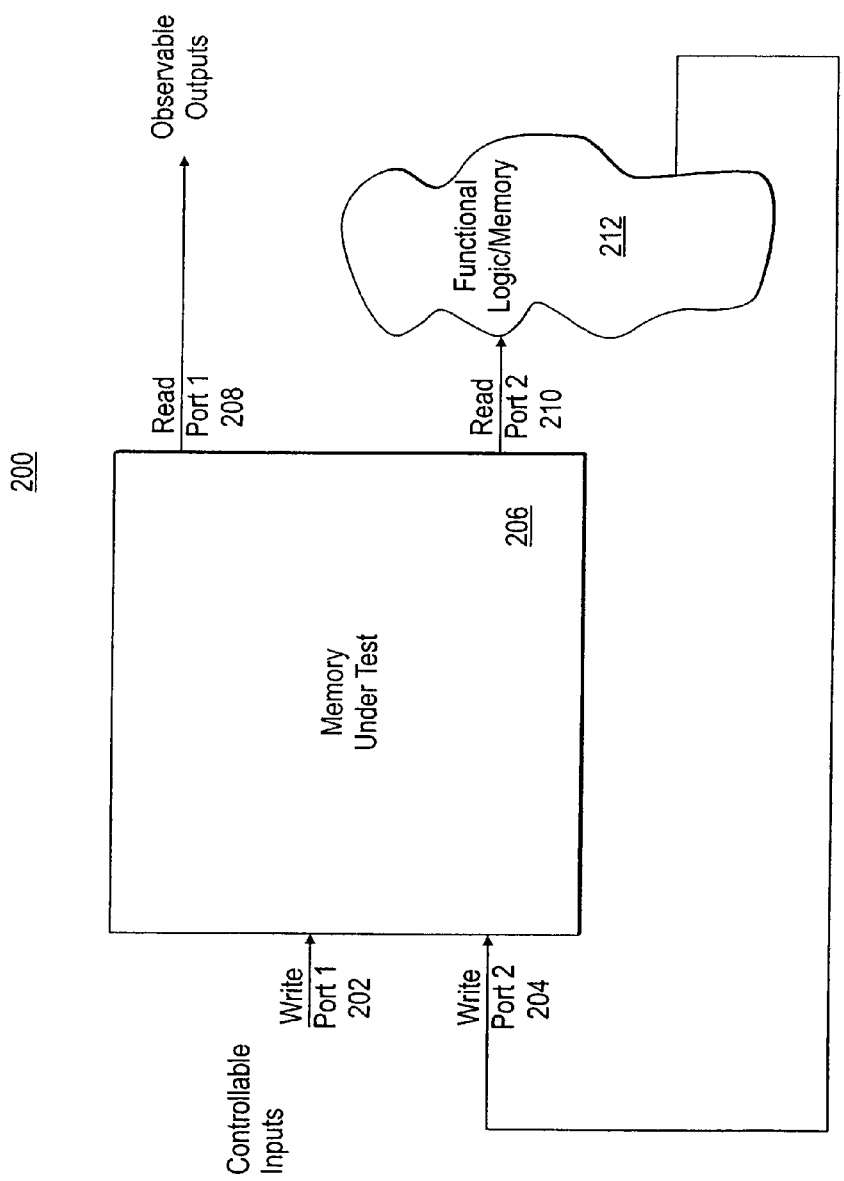
FIG. 2 is a block diagram illustrating a memory system having a multiported memory ("memory under test") and functional logic memory.

The likelihood of having observable outputs from each read port of a multiport memory is even more remote, as illustrated in FIG. 2.

FIG. 2 is a block diagram illustrating a memory system 200 having a multiported memory 206 ("memory under test") and functional/logic memory 212. The multiported memory 206 includes two read ports (read port 1 208 and read port 2 210) and two write ports (write port 1 202 and write port 2 204). The memory system 200 also includes functional logic/memory 212 located on the output of read port 2 210 and feeding the write port 2 204. As such, only write port 1 202 and read port 1 208 are controllable and observable, respectively. This creates the problem of only being able to test the second read port 210 by reading the data out of the memory 206, through the functional logic/memory 212 and back into the same memory 206.

The present invention alleviates the above noted problems by segmenting a portion of the memory as a scratch region and using that portion for "writing through" as explained in connection with FIG. 3. Although the present invention is explained in connection with a two-port memory as illustrated in FIG. 2, those skilled in the relevant art will readily understand that the present invention is equally applicable to multiport memories of varying sizes (e.g., 16, 32, 6, . . . etc.) provided that at least one of the read ports is observable (i.e., no intervening logic that alters the ability to monitor the data effectively for testing).

Figure 3:
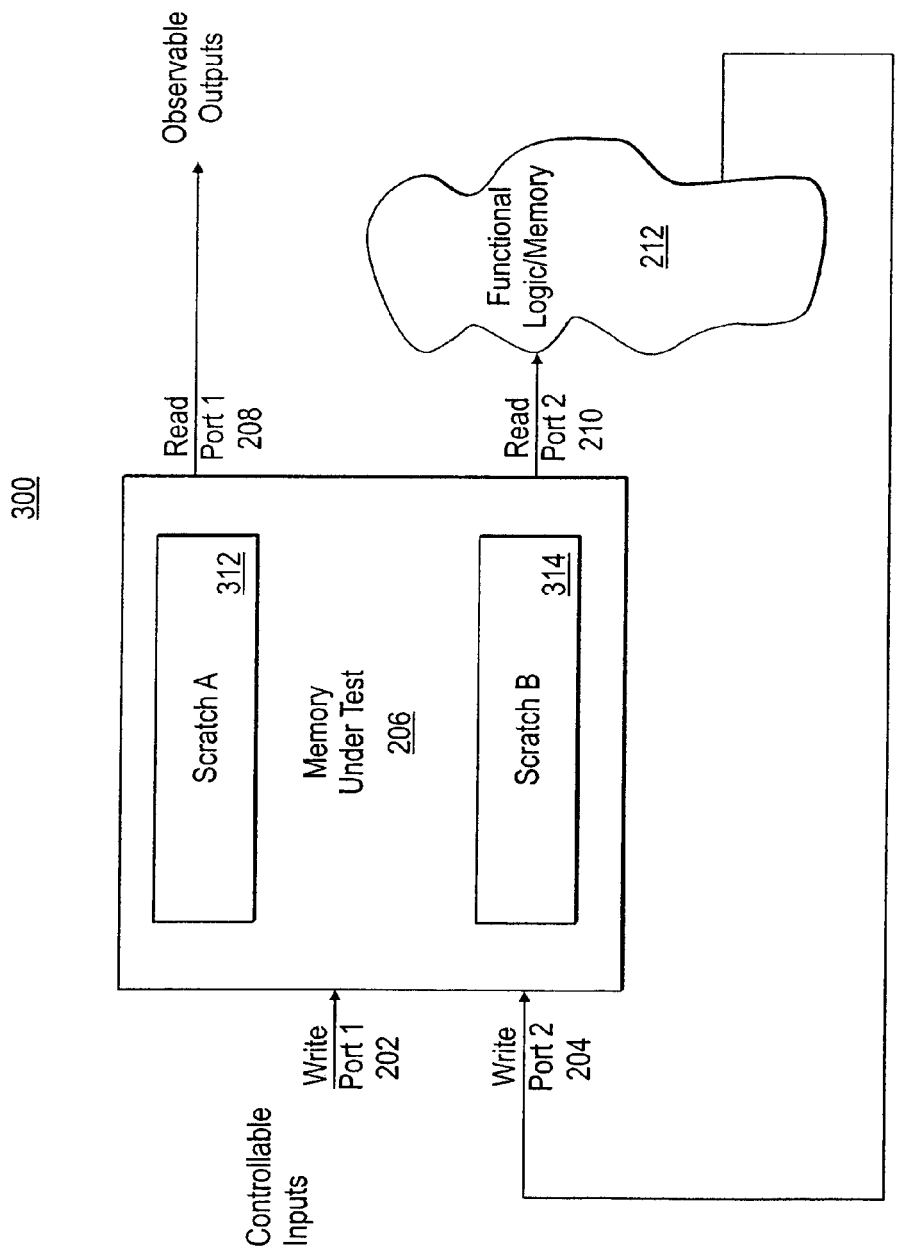
FIG. 3 is a block diagram illustrating the process of the present invention for performing fault testing on the memory according to a preferred embodiment.

FIG. 3 is a block diagram illustrating the process of the present invention for performing fault testing on the multi-ported memory 206 of FIG. 2 according to a preferred embodiment of the present invention. The process of the present invention segments two portions (Scratch A 312 and Scratch B 314) of the memory 206 as scratch regions, and use these scratch regions, A 312 and B 314, for "writing through." At least two portions are required, in order to ensure that the first portion was not defective. An example of using the March C-test pattern for read port 2 and write port 2 (210 and 204) is illustrated in Table II below. In this example, it can be assumed that scratch region A 312 is at address 0, and that scratch region B 314 is at address F.

TABLE II

1. Write 0s at each address throughout memory using write port 1
2. Read 0 (read port 2 through writing on write port 2 to address 0 then reading on read port 1)
then write 1 (write port 1) incrementing through each address in memory
3. Read 1 (read port 2 through writing on write port 2 to address 0 then reading on read port 1)
then write 0 (write port 1) incrementing through each address in memory
4. Read 0 (read port 2 through writing on write port 2 to address 0 then reading on read port 1)
then write 1 (write port 1) decrementing through each address in memory
5. Read 1 (read port 2 through writing on write port 2 to address 0 then reading on read port 1)
then write 0 (write port 1) decrementing through each address in memory
6. Read 0s at each address throughout memory using read port 1
7. Read 0 (read port 2 through writing on write port 2 to address F then reading on read port 1)
then write 1 (write port 1) incrementing through each address in memory
8. Read 1 (read port 2 through writing on write port 2 to address F then reading on read port 1)
then write 0 (write port 1) incrementing through each address in memory
9. Read 0 (read port 2 through writing on write port 2 to address F then reading on read port 1)
then write 1 (write port 1) decrementing through each address in memory
10. Read 1 (read port 2 through writing on write port 2 to address F then reading on read port 1)
then write 0 (write port 1) decrementing through each address in memory
11. Read 0s at each address throughout memory using read port 1

The process of the present invention can be applied either through the pins of the memory 206 or via a Built-In-Self-Test (BIST).

It is thus believed that the operation and construction of the present invention will be apparent from the foregoing description While the method and system shown and described has been characterized as being preferred, it will be readily apparent that various changes and/or modifications could be made therein without departing from the spirit and scope of the present invention as defined in the following claims.

What is claimed is:

1. A method for testing a multi-port memory having a first port and a second port, the method comprising:
    segmenting a first portion of the memory corresponding to the first port;
    writing data, using the second port, to a memory location in the first portion of the memory; and
    reading data on the first port.

2. The method of claim 1 further comprising:
    segmenting a second portion of the memory corresponding to the second port.

3. The method of claim 2 further comprising:
    writing data, using the second port, to a memory location in the second portion of the memory.

4. The method of claim 3 further comprising:
    reading the data written to a memory location in the second portion of the memory on the first port.

5. A method for testing a multi-port memory having a first port and a second port, the method comprising:
    segmenting a first portion of the memory corresponding to the first port;
    segmenting a second portion of the memory corresponding to the second port;
    writing data, using the second port, to a first memory location in the first portion of the memory;
    reading data on the first port from the first memory location;
    writing data, using the second port, to a second memory location in the second portion of the memory; and
    reading data on the first port from the second memory location.

6. A method for testing a multi-port memory comprising:
    segmenting a first portion of the memory corresponding to a first port; and
    testing a second port by writing data to the first portion of the memory corresponding to the first port.

7. The method of claim 6 further comprising:
    reading data on the first port.

8. The method of claim 7 further comprising:
    segmenting a second portion of the memory corresponding to a second port; and
    testing a second port by
        writing data to the to the second portion of the memory; and
        reading data on the first port.

9. An integrated circuit having a multi-port memory comprising:
    means for segmenting a portion of the memory corresponding to a first port; and
    means for testing a second port by writing data to the portion of the memory corresponding to the first port.

10. The integrated circuit of claim 9 comprising:
    means for reading data on the first port.

11. The method of claim 10 further comprising:
    means for segmenting a second portion of the memory corresponding to a second port; and
    means for testing a second port by
        writing data to the to the second portion of the memory; and
        reading data on the first port.

12. An integrated circuit having a multi-port memory comprising:
    means for segmenting a first portion of the memory corresponding to a first port;
    means for segmenting a second portion of the memory corresponding to a second port;
    means for writing data, using the second port, to a first memory location in the first portion of the memory;
    means for reading data on the first port from the first memory location;
    means for writing data, using the second port, to a second memory location in the second portion of the memory; and
    means for reading data on the first port from the second memory location.

* * * * *